United States Patent [19]

Sharpless et al.

[11] Patent Number: 5,141,165
[45] Date of Patent: Aug. 25, 1992

[54] SPRAY GUN WITH FIVE AXIS MOVEMENT

[75] Inventors: John Sharpless, Oberlin; Patrick T. Hogan, Lorain, both of Ohio; Duong T. La, San Diego, Calif.

[73] Assignee: Nordson Corporation, Westlake, Ohio

[21] Appl. No.: 510,001

[22] Filed: Apr. 17, 1990

Related U.S. Application Data

[63] Continuation-in-part of Ser. No. 318,537, Mar. 3, 1989, abandoned.

[51] Int. Cl.⁵ .............................................. B05B 13/04
[52] U.S. Cl. ..................................... 239/752; 239/227; 239/264; 901/43
[58] Field of Search ............... 239/227, 264, 587, 750, 239/752, 753; 901/16, 43; 427/424

[56] References Cited

U.S. PATENT DOCUMENTS

| | | |
|---|---|---|
| 2,384,360 | 9/1945 | Allen et al. . |
| 3,116,882 | 1/1964 | Vork . |
| 3,303,972 | 2/1967 | Van Loben Sels . |
| 3,405,959 | 10/1968 | Walker . |
| 3,561,398 | 2/1971 | Rose et al. . |
| 3,645,452 | 2/1972 | Stoeckel et al. . |
| 3,940,072 | 2/1976 | Ishikawa et al. . |
| 4,205,791 | 6/1980 | Dooley . |
| 4,218,166 | 8/1980 | Abu-Akeel et al. . |
| 4,283,764 | 8/1981 | Crum et al. . |
| 4,313,624 | 2/1982 | Zierden et al. . |
| 4,323,269 | 4/1982 | Pellenc . |
| 4,334,649 | 6/1982 | Dooley . |
| 4,346,849 | 8/1982 | Rood . |
| 4,353,677 | 10/1982 | Susnjara et al. . |
| 4,372,721 | 2/1983 | Harjar et al. . |
| 4,378,959 | 4/1983 | Susnjara . |
| 4,459,898 | 7/1984 | Harjar et al. . |
| 4,547,120 | 10/1985 | Turner, Jr. et al. . |
| 4,561,592 | 12/1985 | Fender et al. . |
| 4,592,495 | 6/1986 | Toda et al. . |
| 4,659,018 | 4/1987 | Shulman . |
| 4,660,501 | 4/1987 | Nagata et al. . |
| 4,679,734 | 7/1987 | Mommsen et al. . |
| 4,693,664 | 9/1987 | Schweiker . |
| 4,703,668 | 11/1987 | Peter . |
| 4,723,713 | 2/1988 | Dahlquist . |
| 4,753,819 | 6/1988 | Shimada . |
| 4,781,517 | 11/1988 | Pearce et al. . |
| 4,784,010 | 11/1988 | Wood et al. . |
| 4,809,885 | 3/1989 | Hayashi et al. . |
| 4,872,417 | 10/1989 | Kuwabara et al. ............ 239/227 X |
| 4,889,004 | 12/1989 | Mailliet et al. .................. 239/227 X |

FOREIGN PATENT DOCUMENTS

| | | |
|---|---|---|
| 0145140 | 6/1985 | European Pat. Off. . |
| 0122034 | 10/1988 | European Pat. Off. . |
| 2850421 | 5/1980 | Fed. Rep. of Germany . |
| 2033336 | 5/1980 | United Kingdom . |
| 2166066 | 4/1986 | United Kingdom . |
| 2171222 | 8/1986 | United Kingdom . |

OTHER PUBLICATIONS

Nordson Technical Publication Apr. 7, 1984.

Primary Examiner—Andres Kashnikow
Assistant Examiner—William Grant
Attorney, Agent, or Firm—Wood, Herron & Evans

[57] ABSTRACT

An apparatus for manipulating a spray device having a spray nozzle relative to a target substrate, which apparatus includes drive mechanisms for moving the spray device in the X, Y and Z directions, and separate mechanisms for rotating the spray nozzle relative to the spray device and for tilting the spray nozzle relative to the spray device.

26 Claims, 4 Drawing Sheets

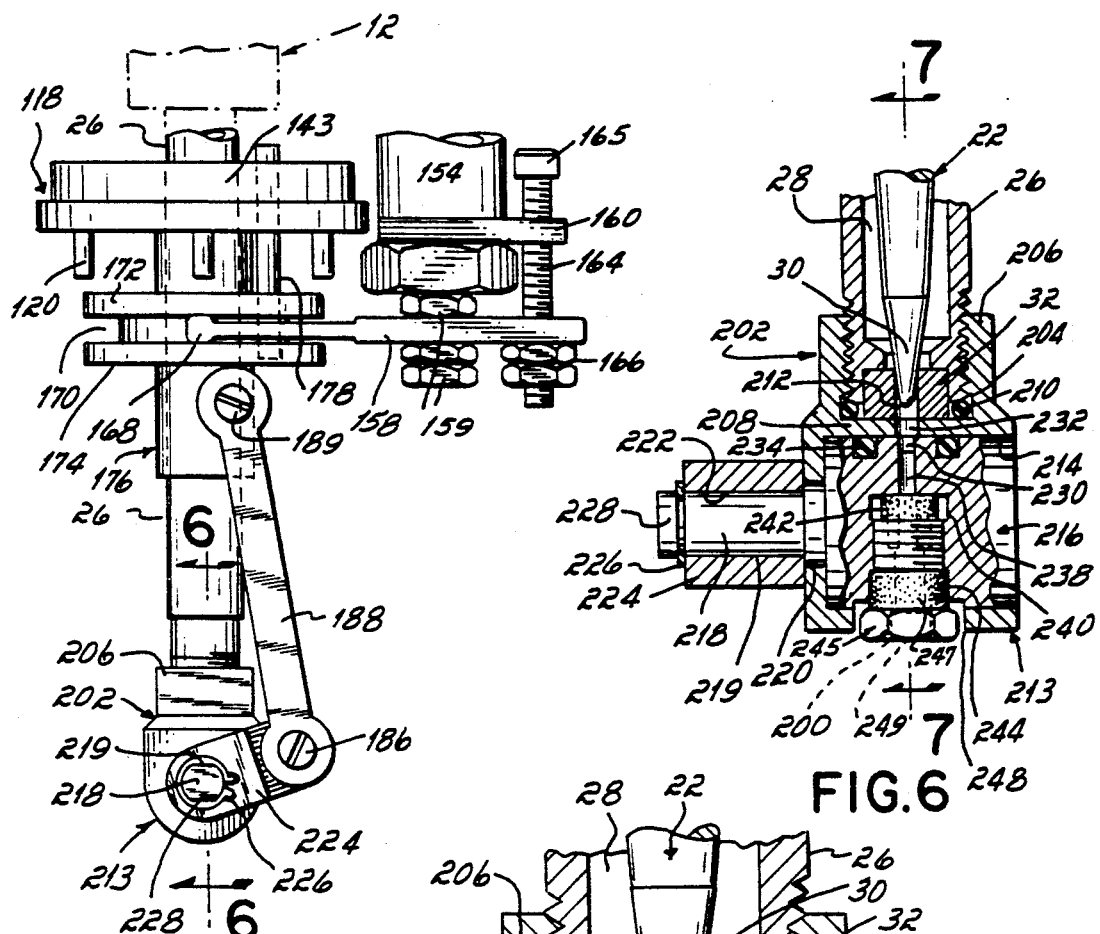

SPRAY GUN WITH FIVE AXIS MOVEMENT

This application is a continuation-in-part of U.S. patent application Ser. No. 07/318,537, filed Mar. 3, 1989 and entitled "Spray Gun With Five Axis Movement", which is assigned to the same assignee as this invention, now abandoned.

FIELD OF THE INVENTION

This invention relates to robot manipulated spray guns, and, more particularly, to a spray gun particularly intended for coating printed circuit boards which is capable of movement along five "axes", namely, movement in a first plane along an X and Y axes, movement in a perpendicular plane along a Z axis, rotation about an axis substantially parallel to the Z axis (the so-called "fourth axis") and pivotal movement in a vertical plane oriented substantially parallel to the Z axis (the so-called "fifth axis" of movement). This invention also contemplates the use of fourth and fifth axis drive mechanisms on a spray gun which is fixed in the X, Y and Z directions and wherein the substrate to be coated is carried on a table movable relative to the spray gun in the X, Y and Z directions.

BACKGROUND OF THE INVENTION

Packaged circuit boards for electronic instruments are typically coated by a moisture-proof insulator film to protect the circuit boards from moisture, electric leakage and dust. Preferably, the moisture-proof insulator films are what are known as conformal coatings, such as acrylic, polyurethane or epoxy synthetic resins dissolved in a volatile solvent. When applied to a clean printed circuit board, a uniform thickness insulative resin film is formed as the solvent evaporates on a continuous basis.

In the past, five principal methods have been used to apply coatings of moisture-proof insulators to printed circuit boards. These methods are discussed in prior U.S. application Ser. No. 06/941,365, filed Dec. 15, 1986, entitled "Method For Applying A Moisture-Proof Insulator Coating on Packaged Circuit Boards", in the name of Takagi Shimada, now U.S. Pat. No. 4,753,819; and, in the continuation-in-part of such application, namely, Ser. No. 07/206,199, filed Jun. 13, 1988, in the name of Takagi Shimada, entitled "Method of Applying A Moisture-Proof Insulative Coating To Printed Circuit Boards Using Triangular or Dovetail-Shaped Liquid Film Emitted From A Flat-Pattern Nozzle", now U.S. Pat. No. 4,880,663. The disclosures of these applications are hereby incorporated by reference in their entirety herein.

As discussed in such applications, the principal methods of applying coatings of moisture-proof insulators to printed circuit boards include:

(a) the immersion method, in which packaged circuit boards are immersed in an immersion tank containing the moisture-proof insulator;

(b) the brush coating method, in which the moisture-proof insulator is applied manually by a brush to the printed circuit board;

(c) the roller method, in which a sheep's wool roll impregnated with a moisture-proof insulator is rolled onto the surface of the printed circuit board to coat it;

(d) the spray method, in which the moisture-proof insulator is applied to the printed circuit board by spraying techniques; and (e) the slit dye method, in which the moisture-proof insulator is pressurized and extruded from the slit dye to eject a film for coating the printed circuit board surface.

As discussed in each of the above-referenced Shimada patent applications, each of the foregoing methods have certain advantages and disadvantages. For example, all methods except brush coating require masking for those parts of the printed circuit board to be left uncoated. The mounting and removal of masks from the board must be done manually which can create a bottleneck in the mass production of circuit boards. Brush coating, while not requiring masking, is labor-intensive and otherwise unsuitable for mass production.

In order to satisfy demand, the most commonly used insulative coating method employed in mass production is the spraying method. Each of the above-referenced Shimada applications discloses a method of spraying insulative liquid coating material onto a printed circuit board in which a flat pattern nozzle is employed and relative movement is effected between the nozzle and circuit board in a direction transverse to the plane of the flat pattern discharged from the nozzle. The supply of coating material to the nozzle is intermittently interrupted so as to prevent a deposit of liquid coating on regions of the printed circuit board and/or circuit components which are to be left uncoated.

One difficulty associated with the coating method disclosed in the above-referenced Shimada applications is to provide for movement of the spray nozzle or circuit board with respect to one another so that the desired pattern of coating material is obtained at all locations on the board. In mass production, robot arms have often been employed to manipulate the spray guns having spray nozzles which are mounted in a fixed position thereon. These robot arms are capable of moving the spray gun and its spray nozzle in a Z direction, i.e., toward and away from the printed circuit board, and in the X and Y directions, i.e., along the length and width of the circuit board.

In order to ensure that the desired pattern of coating material is applied by the spray nozzle in both the X and Y directions of movement of the spray gun, it has been necessary to reorient the spray nozzle, and thus the spray gun, 90° each time the direction of movement is changed from the X direction to the Y direction or vice versa. Rotation of the entire spray gun requires relatively heavy mechanisms which often are difficult to support on a robot arm and/or which reduce the speed of movement of the robot arm.

Another difficulty associated with prior art circuit board coating devices is that the circuit boards are not necessarily planar because circuit components and the like can protrude from the surface thereof. In some applications, it is desirable to coat the vertical sides or underneath portion of a component carried on a circuit board. This cannot readily be accomplished with robot arms capable of moving a spray gun solely in the X, Y and Z directions.

SUMMARY OF THE INVENTION

It is therefore among the objectives of this invention to provide an apparatus for manipulating a spray gun which reduces the amount of movement and inertia required to be controlled during the manipulation of the spray gun and which achieves accurate and efficient placement of coating material onto a target substrate as well as onto components carried on the substrate.

These objectives are accomplished in an apparatus for manipulating a spray gun having a spray nozzle relative to a substrate to be coated, such as a printed circuit board, wherein movement of the spray gun and spray nozzle in the X, Y and Z directions is coupled with independently controlled and actuated movement of the spray nozzle relative to the spray gun. Mechanisms associated with a robot arm which carries the spray gun are operative to move the spray gun and its spray nozzle along the X axis, Y axis and Z axis relative to the printed circuit board or other substrate to be coated. In addition to this movement, the apparatus of this invention includes one mechanism which rotates the spray nozzle of the spray gun about an axis parallel to the Z axis, and another mechanism which pivots the spray nozzle relative to the spray gun independently of the rotational movement. The apparatus of this invention therefore provides for five axis movement of the nozzle of the spray gun, e.g., along each of the X, Y and Z axes, in rotation about an axis parallel to the Z axis (the so-called "fourth axis") and in a pivoting or swinging motion relative to the spray gun (the so-called "fifth axis"). Alternatively, the apparatus of this invention is adapted for use with a spray gun which includes the fourth and fifth axis drive mechanisms but is stationary in the X, Y and Z directions. In this instance, the circuit board to be coated is carried on a table movable in the X, Y and Z directions relative to the fixed spray gun.

In the presently preferred embodiment, a spray gun of the type shown, for example, in U.S. Pat. No. 4,785,996, is modified slightly to accommodate an extension which is rotatably carried within an internal passageway formed in the interior of the gun and extends outwardly from the base of the gun body where the spray nozzle of the gun would ordinarily be mounted. This extension is formed with a coating delivery passageway which receives a movable plunger carried by the gun body. Coating material is introduced into the internal passageway of the gun body through an inlet and flows about the external surface of the plunger into the coating delivery passageway of the extension. The plunger is operative to open and close an outlet formed in the extension, and unused or excess coating material is recirculated through the hollow interior of the plunger back to the gun body for discharge through an outlet communicating with a source of coating material.

A spray nozzle is rotatably mounted to the base of the extension in communication with the coating delivery passageway of the extension. The spray nozzle has a discharge outlet which is offset from the longitudinal axis of the extension and is operative to eject coating material on a substrate such as a printed circuit board when the plunger is moved to the open position.

The spray gun, extension and spray nozzle are movable together along the X axis, Y axis and Z axis by a robot arm. In addition to this movement, separate mechanisms are provided to rotate the extension and spray nozzle relative to the spray gun and to swing or pivot the spray nozzle relative to the spray gun.

In the presently preferred embodiment, the extension and spray nozzle are rotated relative to the spray gun by operation of an indexing wheel fixedly mounted to the extension. The indexing wheel has a number of circumferentially spaced pins each of which is engageable with a pusher plate movable between an extended and retracted position. Each time the pusher plate is extended, it engages one of the pins of the indexing wheel causing the indexing wheel and the extension to rotate with respect to the spray gun. A locking device associated with the indexing wheel maintains it in a rotatably fixed position while the pusher plate is returned from its extended position to the retracted position. All of these components are relatively light in weight which enables them to be used with a variety of robot arms without sacrificing speed of movement of the robot arm or adding appreciable inertial forces caused by excess weight.

Preferably, each stroke or extension of the pusher plate rotates the indexing wheel, and thus the extension and spray nozzle, an angular distance of 90° relative to the spray gun. In this manner, the spray nozzle can be oriented to lay down a desired pattern of coating material in a direction substantially perpendicular to the direction of movement of the spray gun, irrespective of whether the spray gun is moving in the X direction or Y direction. This eliminates the need to move one of the spray gun or the target substrate in order to achieve a desired orientation of the spray pattern relative to the direction of movement of the gun.

In addition to rotation of the extension and spray nozzle relative to the spray gun, a mechanism is provided to pivot the spray nozzle in a plane generally parallel to the axis about which the spray nozzle rotates. In one presently preferred embodiment, a sleeve is slidably mounted to the extension and movable vertically upwardly and downwardly along the extension. The sleeve mounts a yoke which is connected to the piston of a pneumatic cylinder. When the cylinder is actuated to extend the piston, the yoke moves with the piston and forces the sleeve downwardly along the extension. The sleeve is moved upwardly along the extension when the piston is retracted within the cylinder, thus moving the yoke therewith.

Upward and downward movement of the sleeve along the extension produces tilting motion of the spray nozzle through the interconnection of a nozzle crank arm and a nozzle tilt lever. The nozzle crank arm has an upper end pivotably mounted to the sleeve and a lower end pivotably mounted to the nozzle tilt lever. The nozzle tilt lever is fixed to a projection on the spray nozzle which is pivotably carried within an adaptor mounted to the base of the spray nozzle.

In response to downward movement of the sleeve, the nozzle crank arm is moved downwardly which causes one end of the nozzle tilt lever to pivot in either a clockwise or counterclockwise direction. In turn, the spray nozzle is tilted in the same direction through the connection between the nozzle tilt lever and nozzle projection. When the sleeve is then moved in the opposite, upward direction, the nozzle crank arm is moved upwardly, pivoting the nozzle tilt lever and spray nozzle in the opposite direction.

The nozzle crank arm and nozzle tilt lever of this embodiment are therefore effective to pivot the spray nozzle relative to the spray gun so that the discharge orifice of the nozzle is swung in an arcuate path relative to the substrate to be coated. This enables coating material to be directed at an angle relative to the circuit board and components carried thereon in order to coat the sides of such components and/or underneath such components.

In an alternative embodiment, a different mechanism is provided to tilt or pivot the spray nozzle wherein the discharge outlet of the spray nozzle is substantially aligned with the axis of the extension. In this embodiment, the nozzle tilt lever is connected to the shaft of a nozzle support member which is slidably mounted within the interior of a swivel base carried by the extension. The nozzle support member mounts a nozzle holder which carries the spray nozzle in alignment with the longitudinal axis of the extension. In response to upward and downward movement of the nozzle tilt lever, as described above, the nozzle support member, nozzle holder and spray nozzle are slidably pivoted within the swivel base to tilt or swing the discharge outlet of the nozzle in an arcuate path relative to the circuit board and the components carried thereon.

DESCRIPTION OF THE DRAWINGS

The structure, operation and advantages of the presently preferred embodiment of this invention will become further apparent upon consideration of the following description, taken in conjunction with the accompanying drawings, wherein:

FIG. 2A is a fragmentary view of the bottom portion of FIG. 2 illustrating the nozzle angled with respect to the Z axis;

FIG. 4 is an enlarged cross-sectional view taken on line 4—4 of FIG. 2 showing the base of the extension and spray nozzle herein;

FIG. 5 is a fragmentary view similar to FIG. A, but illustrating an alternative embodiment of a mechanism for tilting the nozzle about a "fifth" axis;

FIG. 6 is a cross sectional view taken generally along line 6—6 of FIG. 5; and

FIG. 7 is an enlarged, cross sectional view taken generally along line 7—7 of FIG. 6.

DETAILED DESCRIPTION OF THE INVENTION

Figure 1:
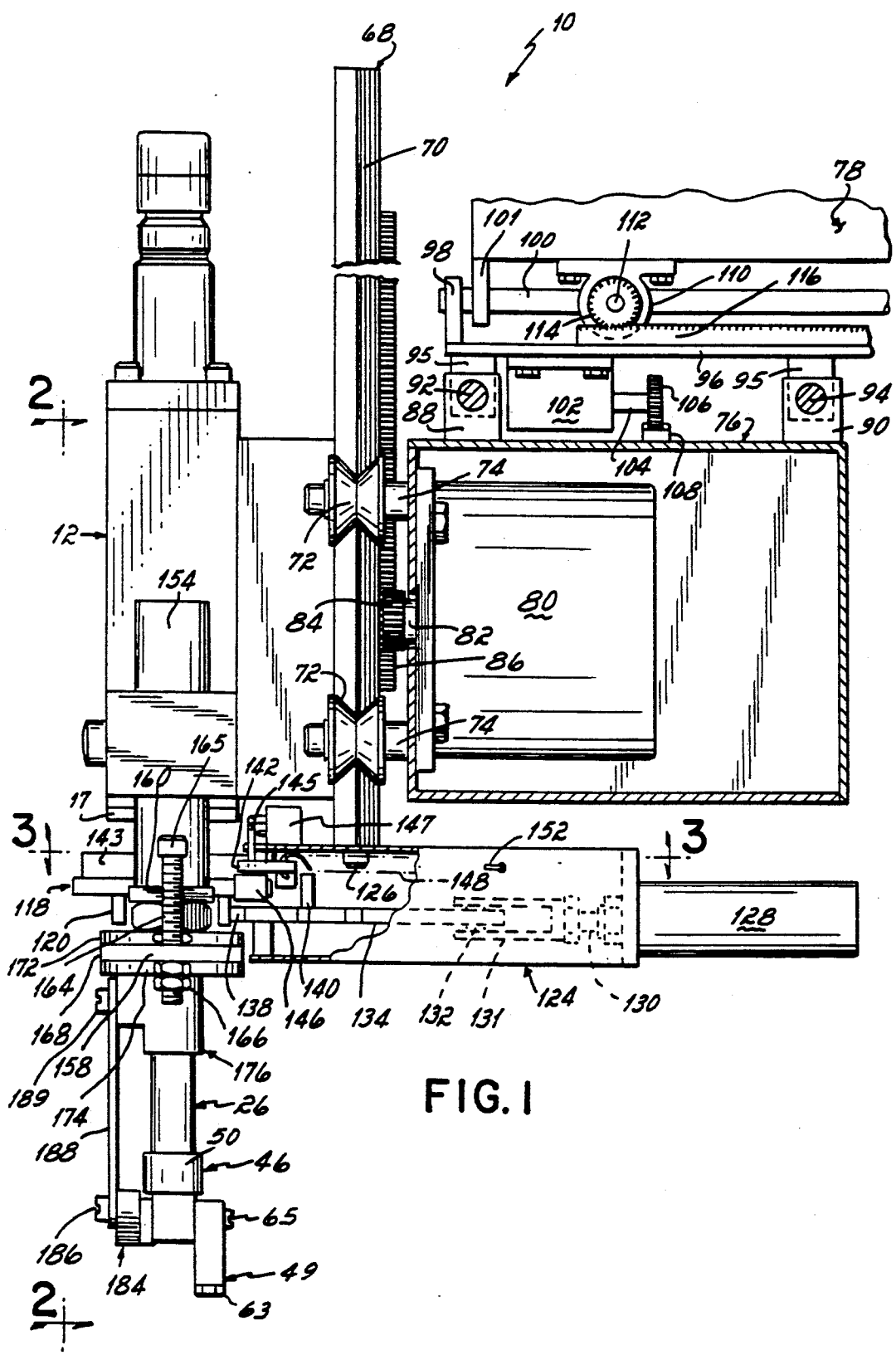
FIG. 1 is a partially schematic, elevational view, partially broken away, of the "five axis" spray gun of this invention including a schematic representation of the mechanisms for moving the spray gun along the X, Y and Z axes.

The apparatus 10 of this invention includes a spray gun 12 of the type disclosed in U.S. Pat. No. 4,785,996, the disclosure of which is incorporated by reference in its entirety herein. The spray gun 12 includes a gun body 14 formed with a stepped bore 16 extending to the bottom end of the gun body 14. A bearing 17 is carried within the bore 16 at the lower end of gun body 14, and a mounting block 18 rests atop the bearing 17. Both the bearing 17 and mounting block 18 are formed with a throughbore 19 and 21, respectively, which receive a movable plunger 22 having a hollow interior 23. A space is formed between the outside of plunger 22 and the throughbore 21 of mounting block 18 which is connected by a passage 24 formed in the mounting block 18 to a fluid inlet port 25 in the gun body 14. Coating material is introduced through port 25 and passage 24 into the throughbore 21 of mounting block 18 and flows along the outside of plunger 22.

The gun body 14 mounts a cylindrical extension 26 which is rotatably carried by the bearing 17. The upper end of cylindrical extension 26 engages a seal 27 at the upper end of the bearing 17 and is captured thereat between the bearing 17 and an annular bottom portion of the mounting block 18. The cylindrical extension 26 is formed with an internal passageway 28 which, at its upper end, communicates with the throughbore 21 in mounting block 18 carrying the coating material. This passageway 28 receives the plunger 22 which extends downwardly to the bottom end of the extension 26. Preferably, the lower end 30 of plunger 22 is tapered and formed to engage a seat 32 located at the bottom end of the extension 26. The plunger 22 is movable between an open, retracted position in which its lower end 30 disengages the seat 32 and uncovers a discharge outlet 34 formed therein, and an extended position shown in which the lower end 30 of plunger 22 engages seat 32 and blocks the discharge outlet 34. This movement of the plunger 22 controls the flow of coating material discharged from the extension 26 for deposition onto a substrate as described below.

Figure 2:
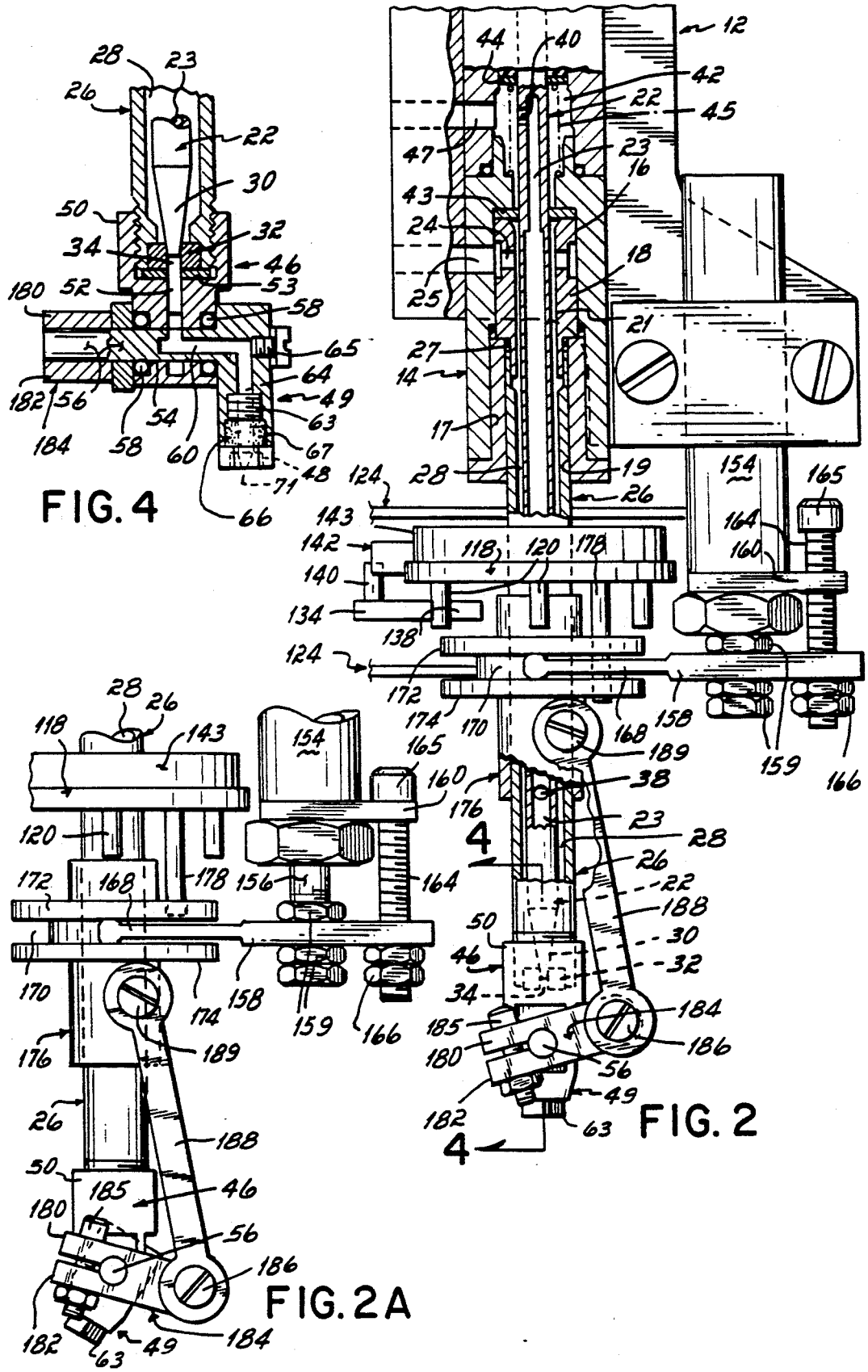
FIG. 2 is a side elevational view as seen on line 2—2 of FIG. 1, in partial cross section illustrating the mechanism for pivoting the spray nozzle of the spray gun herein.

As shown in FIGS. 2 and 4, the coating material flows around the outside of the plunger 22 to its tapered, lower end 30 where it is ejected through the discharge outlet 34 if the plunger 22 is in the retracted, open position. In the event the plunger 22 is in the closed position, and/or in order to remove excess coating material from the extension 26, provision is made to recirculate the coating material from the bottom of the extension 26 upwardly and out of the gun body 14.

In the presently preferred embodiment, the plunger 22 is formed with a port 38 at a point immediately above its lower, tapered end 30. Excess or unused coating material which is not ejected through the discharge outlet 34 enters the port 38 of the plunger 22 and flows upwardly within its hollow interior 23 to a second port 40 formed at the upper end of the plunger 22. The coating material exits the port 40 and enters a cavity 42 formed in the gun body 14 between a seal in the form of a washer 43 located at the top of the mounting block 18 and a similar seal 44 which is held in place by a spring 45. This cavity 42 is connected to a recirculation outlet 47 formed in the gun body 14 which communicates with a source of coating material (not shown). It is contemplated that coating material will be continuously recirculated within the plunger 22 even when a portion of the coating material is ejected through discharge outlet 34. This ensures that the coating material remains heated to the appropriate temperature throughout the operation of spray gun 12.

It should be understood, however, that the instant invention is not intended to be limited to a hollow plunger 22 or other means of recirculating the coating material. It is contemplated that the spray gun 12 could have no means of recirculating the coating material, i.e., the material could be "dead-ended" in the gun when not discharged therefrom.

Referring now to FIG. 4, an adaptor 46 is threaded onto to the bottom end of extension 26 for purposes of mounting a nozzle support member 49 and a spray nozzle 48 thereto. The adaptor 46 has a collar 50 which mates with the external threads on the extension 26, and a bore 52 which communicates with the discharge outlet 34 in the seat 32 at the base of extension 26. A washer 53 is carried by the adaptor 46 which engages seat 32 to create a seal therebetween. The adaptor 46 is formed with a transverse throughbore 54 within which a cylindrical projection 56 of the nozzle support member 49 is rotatably mounted. O-ring seals 58 are interposed between the adaptor 46 and projection 56 to create a fluid-tight seal thereat.

The cylindrical projection 56 is formed with an L-shaped connector bore 60 which communicates at one end with the bore 52 in adaptor 46, and at the other end with fluid delivery passageway 64 formed in the nozzle support member 49. A clean out screw 65 is mounted to the nozzle support member 49 which intersects passageway 64 to permit cleaning thereof and the base of extension 26. The fluid delivery passageway 64 has a stepped lower end formed with internal threads which mounts a nozzle holder 63. Preferably, a Teflon ring 67 is mounted to the exterior of nozzle holder 63 to prevent the leakage of coating material past the mating threads of the passageway 64 and nozzle holder 63. The nozzle 48 is brazed to the base of nozzle holder 63 in the same manner as disclosed in U.S. Pat. No. 4,346,849 to Rood, assigned to the same assignee as this invention, the disclosure of which is incorporated by reference in its entirety herein. As discussed in Pat. No. 4,346,849, the nozzle holder 63 is formed with a throughbore 66 which is counterbored with a seat at its lowermost end. The nozzle 48 is brazed within this seat such that the discharge outlet 71 of nozzle 48 aligns with the throughbore 66 in nozzle holder 63.

A flow path for the coating material is therefore created from the extension 26 to the spray nozzle 48 which includes the bore 52 in adaptor 46, the connector bore 60 in the cylindrical projection 56, the fluid delivery passageway 64 within the nozzle support member 49 and then the throughbore 66 and discharge outlet 71 of the nozzle holder 63 and nozzle 48, respectively. The flow of coating material through this fluid path is controlled by operation of the plunger 22 in moving between a retracted, open position relative to the discharge outlet 34 in seat 32, and a closed, extended position.

X Axis, Y Axis and Z Axis Gun Movement

A principal feature of this invention is the construction and operation of the mechanisms for moving the spray gun 12 and its spray nozzle 48 relative to a target substrate such as a printed circuit board. Mechanisms associated with the robot arm which supports the spray gun 12 are effective to move the spray gun 12 along the X axis, Y axis and Z axis. The details of such mechanisms form no part of this invention per se, and the following description of the X, Y and Z axis movement of the spray gun 12 is provided only for purposes of discussing the overall operation of the apparatus 10. Moreover, it is contemplated that in an alternative embodiment the spray gun 12 would be held stationary and drive mechanisms would be provided to move a table (not shown) carrying the circuit board along the X, Y and Z axes.

For purposes of the present description, the term "top" refers to the upper portion of the spray gun 12 as illustrated in FIGS. 1 and 2, and the term "bottom" refers to the lower portion of the gun body 14 in such FIGS. The "X axis" is an axis extending left to right as illustrated in FIG. 1, the "Y axis" is an axis extending in and out of the page of FIG. 1 and the "Z axis" is an axis extending in a vertical direction between the top and bottom of FIG. 1.

Referring now to FIG. 1, the spray gun 12 is fixedly mounted to a gun mounting plate 68 having vertically extending side edges 70, one of which is shown in FIG. 1. The gun mounting plate 68 is captured between four rollers 72, two of which are located on each side edge 70 of the mounting plate 68. Each of the rollers 72 is rotatable on a pin 74 which is fixed to a frame 76 carried by the robot arm 78 illustrated schematically in FIG. 1.

The frame 76 mounts a motor 80 whose output shaft 82 is drivingly connected to a pinion gear 84. This pinion gear 84 meshes with a rack 86 fixed to the gun mounting plate 68. When the motor 80 is activated, the pinion gear 84 is rotated in either a clockwise or counterclockwise direction relative to the rack 86. The driving connection between the pinion gear 84 and rack 86 causes the gun mounting plate 68 to move vertically, i.e., along the Z axis, between the rollers 72 on each of its side edges 70. Such motion of the gun mounting plate 68 carries the spray gun 12 and spray nozzle 48 therealong to position the spray nozzle 48 at the desired vertical location with respect to a substrate such as a circuit board to be coated.

Movement of the spray gun 12 and spray nozzle 48 in the Y direction is obtained as follows. The top plate of the frame 76 mounts four bearing blocks 88, 90 (two of which are shown) which are carried by guide rods or linear ways 92, 94, respectively, mounted by posts 95 to a support plate 96. The support plate 96, in turn, is mounted by posts 98, one of which is shown in FIG. 1, to guide rods 100 supported on a bearing bracket 101 by the robot arm 78.

A motor 102 is fixed to the bottom of support plate 96 and has an output shaft 104 drivingly connected to a pinion gear 106. This pinion gear 106 meshes with a rack 108 mounted to the top plate of frame 76 which extends in a Y direction therealong. In response to operation of the motor 102, the pinion gear 106 drivingly engages the rack 108 and moves the frame 76, and thus the spray gun 12 and spray nozzle 48, in a Y direction along the Y axis as defined above.

Movement of the spray gun 12 and spray nozzle 48 in the X direction or along the X axis is obtained in a similar manner to movement along the Y axis. A third motor 110 mounted to the robot arm 78 has an output shaft 112 carrying a pinion gear 114. The pinion gear 114 drivingly engages a rack 116 which is mounted atop the support plate 96 and extends in an X direction therealong. In response to rotation of the output shaft 112 and pinion gear 114, the support plate 96, frame 76 and thus spray gun 12 and spray nozzle 48, all move in the X direction with respect to the fixed robot arm 78.

It should be understood that the drive mechanisms described above for moving the spray gun 12 and spray nozzle 48 along the X, Y and Z axes are not intended to be restrictive, it being understood that a variety of other mechanisms could as well be employed to obtain such X, Y and Z movement.

Fourth Axis Movement—Rotation of Spray Nozzle

Referring now to FIGS. 3, 3A, 3B and FIG. 1, the mechanism for rotating the spray nozzle 48 with respect to the spray gun 12 is illustrated. As described above, the spray gun 12 and spray nozzle 48 move as a unit in the X, Y and Z directions. The mechanism for fourth axis movement, however, is effective to rotate the spray nozzle 48 independently of the remainder of spray gun 12 and independently of any movement of the robot arm 78.

An indexing wheel 118 is fixedly mounted to the extension 26 beneath the bottom end of the gun body 14. The indexing wheel 118 has four downwardly extending pins 120a-d which are spaced 90° from one another at the same radial distance from the center of the index wheel 118. Four recesses 122a-d are formed in the periphery of the index wheel 118 in radial alignment with the pins 120a-d, respectively.

Figure 3:
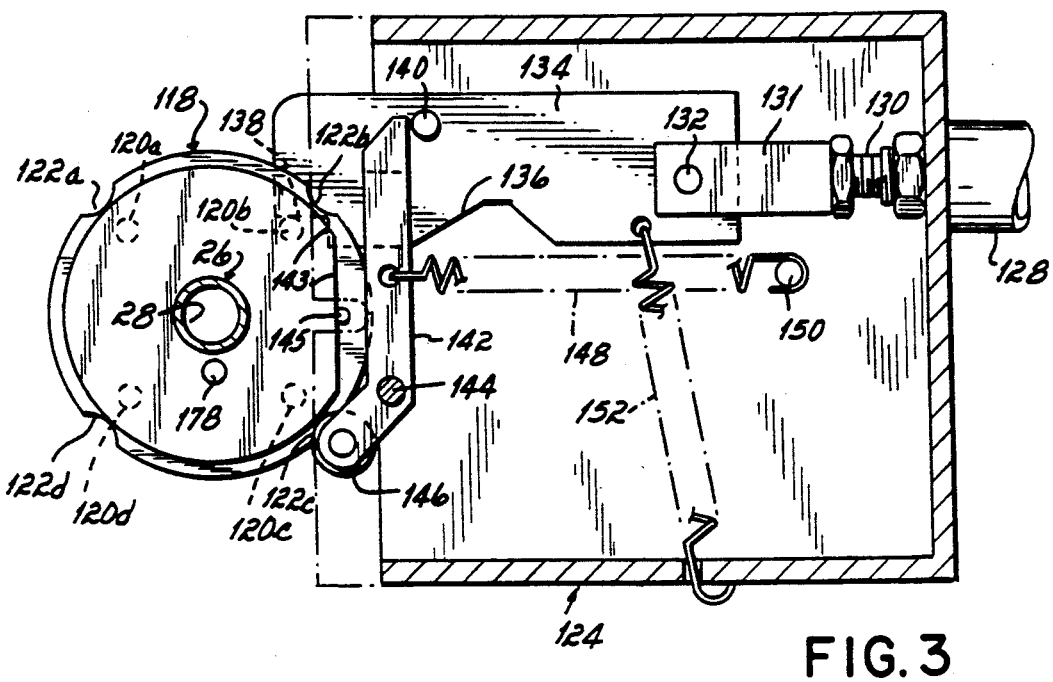
FIG. 3 is a cross sectional view taken on line 3—3 of FIG. 1 illustrating the mechanism for rotating the spray nozzle of the spray gun herein, with the pusher plate in a retracted position.
Figure 3A:
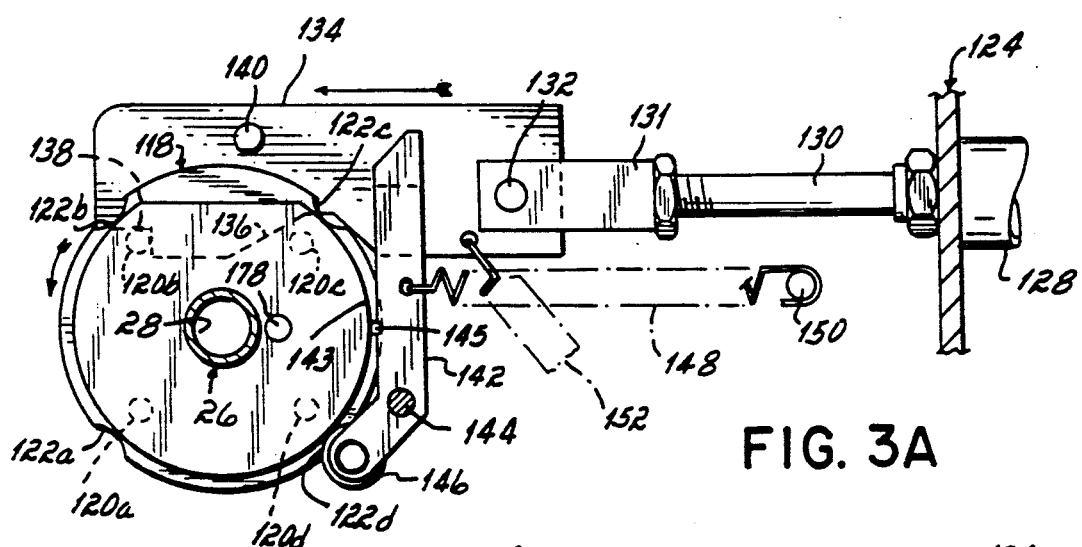
FIG. 3A is a view similar to FIG. 3 with the pusher plate in an extended position.
Figure 3B:
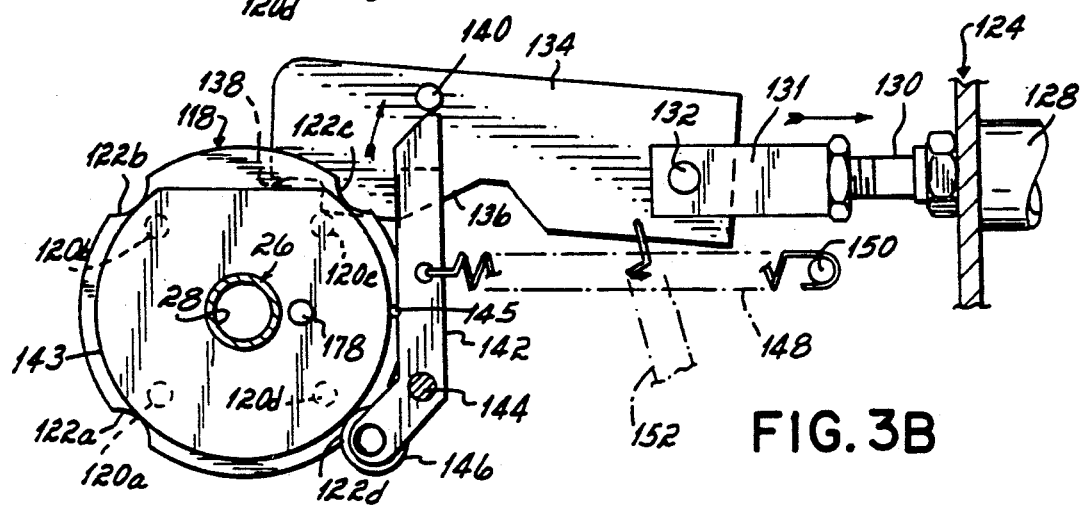
FIG. 3B is a view similar to FIGS. 3 and 3A with the pusher plate in the process of being moved to its retracted position.

A support frame 124 is cantilevered outwardly from one side of the index wheel 118 and is mounted in that position by screws 126 to the underside of the gun mounting plate 68. This support frame 124 carries a pneumatic cylinder 128 having a piston 130 which is movable between an extended position as shown in FIG. 3A, and a retracted position as shown in FIG. 3 and as described in more detail below. The piston 130 is fixed to a yoke 131, which, in turn, is pivotally mounted at 132 to a pusher plate 134. The pusher plate 134 is formed with a cam surface 136 on one side intermediate its two ends, and a notch 138 at its forward or lefthand end as viewed in FIGS. 3-3B. A pin 140 extends upwardly from the top surface of the pusher plate 134 for purposes to become apparent below.

The forward or lefthand side of the support frame 124 mounts a locking arm 142 which is pinned thereto at 144. One end of the locking arm 142 is angled and mounts a roller 146 which is engageable with the recesses 122 in the periphery of the index wheel 118. A spring 148 extending between the locking arm 142 and a post 150 carried by the support frame 124 urges one end of the locking arm 142 in a clockwise direction as viewed in FIGS. 3-3B so that the roller 146 is retained against the periphery of index wheel 118.

The operation of the fourth axis mechanism of this invention is as follows. In the position illustrated in FIG. 3, the piston 130 of pneumatic cylinder 128 is in a retracted position wherein the pin 140 on the pusher plate 134 is located rearwardly of locking arm 142, and the pin 120b of index wheel 118 is located within the notch 138 of pusher plate 134. A spring 152 connected between the pusher plate 134 and frame 124 urges the pusher plate 134 against pin 120b. In addition, the roller 146 of locking arm 142 is seated within the recess 122c in the periphery of index wheel 118 so as to retain the index wheel 118 in a fixed, rotational position.

Referring to FIG. 3A, when the pneumatic cylinder 128 is operated to extend piston 130, two movements occur in sequence. First, the pin 140 on the pusher plate 134 engages the locking arm 142 to pivot it about pivot 144 so that the roller 146 disengages the recess 122c on index wheel 118. This frees the index wheel 118 from its locked position enabling it to rotate. Further forward movement of the pusher plate 134, as the piston 130 is extended, causes the notch 138 of pusher plate 134 to engage the pin 120b of index wheel 118. The pusher plate 134 rotates the index wheel 118, attached extension 26 and spray nozzle 48 due to its engagement with pin 120b, and the roller 146 of the locking arm 142 rides along the periphery of the index wheel 118.

When the piston 130 is fully extended as in FIG. 3A, the pusher plate 134 has moved the index wheel 118 approximately 90, i.e., the pin 120b has been moved to the position originally occupied by pin 120a as viewed in FIG. 3. In the course of moving in the forward direction, the pusher plate 134 travels in an arcuate path because of the circular shape of index wheel 118, and this is permitted by the pivotal connection between the pusher plate 134 and the yoke 131 connected to piston 130. This arcuate path permits pin 140 to pass around the end of lock arm 142 and free the lock arm for reengagement with the periphery of wheel 118. At the point of full extension of piston 130, the roller 146 of locking arm 142 seats in a recess on the periphery of index wheel 118, i.e., recess 122d as viewed in FIG. 3A. This locks the index wheel 118 in a fixed rotational position while the pusher plate 134 is returned to its initial position with the retraction of piston 130.

In the course of returning to its initial position, the cam surface 136 of the pusher plate 134 rides along the pin 120c which has been moved to the position originally occupied by pin 120b. See FIG. 3B. This cam surface 136 is effective to force the pusher plate 134 outwardly with respect to the locking ar 142 so that the pin 140 on pusher plate 134 can clear locking arm 142 and return to its original position rearwardly of locking arm 142 as illustrated in FIG. 3.

In the presently preferred embodiment, a cam plate 143 is carried atop the indexing wheel 118. A trip lever 145 connected to a limit switch 147 rides against the outer periphery of cam plate 143. Upon reaching a predetermined position along the cam plate 143, the trip lever 145 activates the limit switch 147 to signal that the indexing wheel 118 is located in a "home" position, i.e., that the four pins 120a-d are oriented in a position such as shown in FIG. 3.

The above-described procedure is then repeated to index the indexing wheel 118 another 90° with respect to the longitudinal axis of the extension 26. A controller (not shown) associated with the robot arm controls is effective to control the operation of the pneumatic cylinder 128 s that the speed and frequency of the rotation of indexing wheel 118 can be altered as desired. Depending upon the requirements of a particular application, it is contemplated that the pneumatic cylinder 128 may be operated to extend and retract the piston 130 slowly or rapidly, and/or at high or low frequency, to obtain the desired rotational movement of the spray nozzle 48.

Fifth Axis Movement—Pivoting of Spray Nozzle

Referring to FIGS. 2 and 2A, one embodiment of the mechanism for tilting the spray nozzle 48 with respect to the extension 26 and spray gun 12 is illustrated. This mechanism is effective to "tilt" or pivot the spray nozzle 48 along an arcuate path independently of the movement of the spray gun 12 along the X, Y and Z axes, and independently of the rotation of the spray nozzle 48 described above.

A pneumatic cylinder 154 is mounted to the gun mounting plate 68 and has a piston 156 fixedly mounted to a yoke 158 by nuts 159. A stop plate 160 is mounted at the base of the pneumatic cylinder 154 and is formed with a slot or bore which slidably receives a stop bolt 164. The stop bolt 164 is connected by adjustment nuts 166 to the yoke 158 and is movable therewith in response to extension and retraction of t e piston 156.

The yoke 158 has a pair of spaced arms 168, one of which is shown in the FIGS., which are loosely received in a groove 170 formed by an upper disc 172 and a lower disc 174 of a sleeve 176. The sleeve 176 is generally cylindrical in shape and is slidably mounted on the extension 26 for movement therealong in the vertical direction, i.e., parallel to the Z axis. Preferably, a connector pin 178 extends between the upper disc 172 and the index wheel 118 described above so as to maintain the relative rotational position of the index wheel 118 and vertically movable sleeve 176.

As mentioned above, the nozzle support member 49 is rotatably carried within the transverse throughbore 54 of adaptor 46 and the projection 56 of nozzle support member 49 extends outwardly therefrom. This projection 56 of nozzle support member 49 is clamped between a pair of arms 180, 182 which form part of a nozzle tilt lever 184. The arms 180, 182 of tilt lever 184 are spaced from one another and have a notch therebetween which circumscribes the projection 56. A bolt 185 extends between the arms 180, 182 which urges the arms 180, 182 together in clamping engagement with the projection 56 so that movement of the nozzle tilt lever 184 is directly transmitted to the nozzle support member 49, nozzle holder 63 and nozzle 48.

One end of the nozzle tilt lever 184 is pivotally mounted by a pin 186 to the lower end of a nozzle crank arm 188. The opposite, upper end of the nozzle crank arm 188 is pivotally mounted by a pin 189 to the sleeve 176 immediately beneath the bottom disc 174.

With reference to FIGS. 2, 2A and 4, pivotal motion of the spray nozzle 48 is obtained as follows. The pneumatic cylinder 154 is actuated to extend to the piston 156 and thus move the yoke 158 and stop bolt 164 downwardly as viewed in the FIGS. In turn, the yoke 158 forces the sleeve 176 downwardly along the extension 26. This movement of sleeve 176 forces the nozzle crank arm 188 downwardly which pivots the nozzle tilt lever 184 in a clockwise direction as viewed in FIG. 2A. Because of the attachment between the nozzle tilt lever 184 and the projection 56, the spray nozzle 48 pivots in the same direction of movement as the nozzle tilt lever 184. The discharge outlet 71 of spray nozzle 48 is therefore tilted or pivoted in a clockwise direction through an arc corresponding to the amount of pivotal movement of the nozzle tilt lever 184.

In response to movement of the piston 156 in the opposite, upward direction, the yoke 158 pulls the sleeve 176 upwardly carrying with it the nozzle crank arm 188. This upward movement of the nozzle crank arm 188 pivots the nozzle tilt lever 184 in the opposite, counterclockwise direction, thus tilting or pivoting the nozzle support member 49, and, hence, the nozzle 48, in the same direction. Vertically upward and downward movement of the piston 156, yoke 158, sleeve 176 and nozzle crank arm 188 is thus converted into pivotal or tilting motion of the spray nozzle 48 by the nozzle tilt lever 184.

The extent of pivotal motion imparted to the spray nozzle 48 is controlled by the stop bolt 164. As shown in FIG. 2A, the head 165 of stop bolt 164 is positioned on the upper side of the stop plate 160. As the piston 156 is extended and moves the yoke 158 downwardly, the stop bolt 164 is carried with the yoke 158. When the head 165 of stop bolt 164 engages the fixed stop plate 160, further downward movement of the piston 156 is prohibited. This controls the amount of vertical travel of the sleeve 176 along the extension 26, which, in turn, controls the movement of nozzle crank arm 188 and nozzle tilt lever 184. The position of the head 165 of stop bolt 164 relative to the fixed stop plate 160 is adjustable by loosening the nuts 166 and moving the stop bolt 164 along the yoke 158.

Referring now to FIGS. 5-7, an alternative embodiment of the mechanism for pivoting a spray nozzle 200 is illustrated. The spray nozzle 200 is rotated with respect to the spray gun 12 in the identical manner as nozzle 48 described above with reference to FIGS. 2, 2A and 4, but different structure is provided to "tilt" or pivot the spray nozzle 200 along an arcuate path independently of the movement of the spray gun 14 along the X, Y and Z axes. The structure of the embodiment of FIGS. 5-7 which is common to that of FIGS. 2, 2A and 4 is given the same reference numbers in FIGS. 5-7.

The primary difference between the embodiment of FIGS. 5-7, and that of FIGS. 2, 2A and 4, is that the spray nozzle 200 in the embodiment of FIGS. 5-7 is oriented along substantially the same longitudinal axis as the extension 26, whereas the nozzle 48 of the previously described embodiment is offset from the axis of extension 26. See FIG. 4. It has been discovered that in some applications, this offset of the nozzle 48 makes it difficult for robot arms and other automatic manipulating mechanisms to properly align the nozzle 48 with respect to a substrate. In some cases, it is easier to position the spray nozzle 200 relative to a substrate when it is located along substantially the same axis as the extension 26 of the spray gun 12. Another advantage of aligning the nozzle 200 with the axis of the extension 26 is that conversion from four axis to five axis operation, or vice versa, is simplified. For example, if the robot arm is initially programmed for four axis operation, the spray gun 12, extension 26 and nozzle 200 are movable relative to the X, Y and Z axes and the nozzle 200 is permitted to rotate but not pivot. In order to convert to five axis operation, i.e., with the addition of pivotable movement of the nozzle, there is no need to reprogram the robot arm's movements along the X and Y axes with the embodiment of FIGS. 5-7 herein. Because the nozzle 200 is located along the axis of extension 26, the extension 26 and nozzle 200 can be allowed to rotate and pivot to obtain better coverage of the target surface, as desired, without requiring adjustment of the robot arm movement in manipulating the extension 26 and nozzle 200 about the X and Y axes.

Referring now to FIGS. 5-7, the mechanism for producing tilting or pivotal movement of the spray nozzle 200 comprises a swivel base 202 having an upper cavity 204 defined by an annular wall 206 and a bottom wall 208. The annular wall 206 is formed with internal threads which are adapted to mate. With external threads on the bottom portion of the extension 26 so as to interconnect the swivel base 202 and extension 26. Preferably, the seat 32 for the tip or lower end 30 of plunger 22 rests upon the bottom wall 208, and an O-ring 210 extends about the seat 32 in between the bottom edge of the extension 26 and the bottom wall 208. With the extension 26 and swivel base 202 in an assembled position as shown in FIGS. 6 and 7, the passageway 28 within extension 26 aligns with the bore 212 in seat 32 for the transfer of coating material therebetween.

A lower body portion 213 of swivel base 202 is formed with a throughbore 214 which pivotally and slidably mounts a nozzle support member 216. This nozzle support member 216 has a shaft 218 having flats 219 which extends outwardly from the annular throughbore 214 in swivel base 202 through an opening 220 therein. The shaft 218 with flats 219 is fixedly mounted within a mating bore 222 formed in a tilt lever 224 and this tilt lever 224 is retained upon the shaft 218 against the swivel base 202 by a snap ring 226 connected to an outer end 228 of the shaft 218. The opposite end of the tilt lever 224 is connected by the pin 186 to the nozzle crank arm 188, the structure and operation of which are described above in connection with the embodiment of FIGS. 2, 2A and 4.

As viewed in FIG. 7, the upper portion of the nozzle support member 216 is formed with a circumferentially extending slot 230 which communicates with the bore 212 in the seat 32 through a feed port 232 formed in the swivel base 202. This slot 230 extends along a portion of the outer circumference of the nozzle support member 216 in between an 0-ring 234 carried within an elongated recess 236 formed in the nozzle support member 216. The slot 230 is joined to a connector passageway 238 in the nozzle support member 216 which, in turn, extends to a cavity 240 within the nozzle support member 216 carrying a spacer 242.

The spacer 242 is interposed between the connector passageway 238 and a nozzle holder 245 which mounts the nozzle 200 as described below. The nozzle holder 245 is received within a bore 244 extending from the base of nozzle support member 216 to the cavity 240. The upper portion of this bore 244 has internal threads adapted to mate with external threads on the nozzle holder 245 so that the nozzle holder 245 can be threaded into the nozzle support member 216 and tightened down against the spacer 242. Preferably, the unthreaded, lower portion of nozzle holder 245 mounts a Teflon ring 247 which seals the bore 244 beneath its internal threads to prevent the leakage of coating material therepast.

The nozzle 200 is preferably brazed to the base of nozzle holder 245 in the manner described above in connection with FIG. 4 and as disclosed in U.S. Pat. No. 4,346,849 to Rood. As discussed in U.S. Pat. No. 4,346,849, the nozzle holder 245 is formed with a throughbore 246 which is counterbored at its lowermost end to provide a cylindrical seat. The nozzle 200 is brazed to the nozzle holder 245 within this cylindrical seat such that the discharge outlet 249 of nozzle 200 aligns with the throughbore 246 in nozzle holder 245. As viewed in FIG. 7, with the nozzle 200 installed in nozzle holder 245, a flow path is created from the passageway 28 in extension 26, into bore 212 of seat 32, through the feed port 232 in swivel base 202 into the slot 230 and the connector passageway 238 within the nozzle support member 216, and then through the throughbore 246 in nozzle holder 245 into the discharge outlet 249 of the nozzle 200.

The flow path described above in the embodiment of FIG. 7 is relatively short, and this can provide advantages over that disclosed in the embodiments of FIGS. 1-5. As shown in FIG. 4, for example, a relatively long flow path is formed between the seat 32 and the nozzle 48. It has been found that such a long flow path can produce start up problems, i.e., a large slug of material residing in such flow path is discharged when the plunger 22 is initially moved to an open position, and at least some of the material downstream from the plunger 22 can drip out of the nozzle 200 when the plunger is returned to a closed position. Additionally, it has been found that the material within the flow path between the plunger 22 and nozzle 48 can be slung outwardly from the nozzle 48 in the course of movement thereof due to the relatively large volume of material in such flow path. The embodiment of FIG. 7 reduces or eliminates these problems by providing a much shorter flow path between the plunger 22 and nozzle 200 which carries much less volume of material.

The operation of the tilting or pivoting mechanism for the nozzle 200 is as follows. In response to reciprocation of the nozzle crank arm 188 as described above in connection with FIGS. 2, 2A and 4, one end of the tilt lever 224 is moved upwardly and downwardly. See FIG. 5. Due to the connection between the opposite end of the tilt lever 224 and the shaft 218 of nozzle support member 216, the nozzle support member 216 is slidably pivoted within the annular throughbore 214 in the swivel base 202 as the tilt lever 224 is reciprocated. Such sliding, pivotal movement of the nozzle support member 216 within the throughbore 214, tilts or pivots the spray nozzle 200 with respect to the axis of the extension 26 so as to direct coating material at the desired angle through the discharge outlet 249 of the nozzle 200.

In order to accommodate the tilting or sliding movement of the nozzle support member 216 within swivel base 202, the bottom portion of swivel base 202 is formed with an elongated opening 248 communicating with the annular throughbore 214 therein so that the nozzle 200 is permitted to tilt or pivot with the nozzle support member 216 along an arc equal to the distance between the opposed edges 250 and 252 of the elongated opening 248. The distance or arc between the opposed edges 250, 252 of opening 248 is chosen to correspond to the stroke or vertical movement of the nozzle crank arm 188 so that pivotal movement of the nozzle support member 216 and nozzle 200 within the swivel base 202 is not restricted and the nozzle 200 does not contact the edges 250, 252 of opening 248. Additionally, the circumferentially extending slot 230 at the top of nozzle support member 216 is configured to maintain communication with the feed port 232 in the swivel base 202 as the nozzle support member 216 slides or pivots within the annular throughbore 214 of swivel base 202. The slot 230 is of sufficient circumferential length so as to always maintain communication with the feed port 232 throughout the extent of the sliding movement of the nozzle support member 216 within the swivel base 202.

As mentioned above, the primary advantage of the construction illustrated in FIGS. 5-7 is that the spray nozzle 200 is oriented generally in alignment with the longitudinal axis of the extension 26. While the nozzle 200 is permitted to tilt or pivot relative to the extension 26, the offset between the nozzle 48 and extension 2 which is present in the embodiment of FIGS. 2, 2A and 4 is substantially avoided.

While the invention has been described with reference to a preferred embodiment, it will be understood by those skilled in the art that various changes may be made and equivalents may be substituted for elements thereof without departing from the scope of the invention. In addition, many modifications could be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

We claim:
1. Apparatus for applying a coating material to a surface, comprising:
a spray device including an extension, said spray device being formed with an internal passageway having an inlet communicating with a source of coating material and an outlet formed in said exten- sion, said internal passageway carrying a valve which is movable between an open position and a closed position with respect to said outlet formed in said extension;

a spray nozzle having an inlet and a discharge outlet;

mounting means for pivotally mounting said spray nozzle to said extension, said mounting means including:
  (i) an adaptor connected to said extension, said adaptor being formed with a bore;
  (ii) a nozzle support member rotatably carried within said bore of said adaptor, said nozzle support member having a bore within which said spray nozzle is fixedly mounted;
  (iii) said adaptor being formed with at least one passageway which interconnects said outlet of said extension with said bore of said nozzle support member for transmitting coating material from said extension into said spray nozzle;

means for producing relative movement between said spray device and said surface along an X axis;

means for producing relative movement between said spray device and said surface along a Y axis, said Y axis being perpendicular to said X axis;

means for pivoting said spray nozzle with respect to said extension.

2. The apparatus of claim 1 in which said spray device is formed with a fluid inlet and a recirculation outlet, said extension comprising a first member rotatably mounted to said spray device, said first member being formed with a passageway communicating with said fluid inlet for receiving coating material, said passageway terminating in a discharge outlet, said passageway in said first member carrying a plunger having a hollow interior which is movable between an open position relative to said discharge outlet in said first member wherein coating material is ejected from said discharge outlet and a closed position in which said plunger blocks the flow of coating material through said discharge outlet, said plunger being formed with a first port at one end which transmits coating material from said passageway in said first member into said hollow interior of said plunger, and said plunger being formed with a second port at an opposite end thereof which communicates with said recirculation outlet in said spray device to discharge coating material from said interior of said plunger.

3. The apparatus of claim 1 further comprising means for rotating said extension, said means comprising:

an indexing wheel mounted to said extension, said indexing wheel having pins each radially spaced from the center thereof and circumferentially spaced from one another;

locking means for releasably locking said indexing wheel against rotation;

a pusher plate movable in a first direction and in an opposite, second direction, said pusher plate in the course of moving in said first direction being effective to sequentially disengage said locking means from said indexing wheel and then contact one of said pins of said indexing wheel to rotate said indexing wheel and said extension, said locking means being effective to re-engage said indexing wheel prior to movement of said pusher plate in said opposite, second direction to retain said indexing wheel stationary in preparation for engagement of said pusher plate with another of sad pins on said indexing wheel.

4. The apparatus of claim 3 in which said indexing wheel is formed with spaced recesses in the outer periphery thereof, said locking means comprising a locking arm pivotable with respect to said indexing wheel, said locking arm having a roller at one end which is formed to seat within each of said recesses of said indexing wheel, said locking arm being effective to retain said indexing wheel stationary when said roller seats within one of said recesses in said indexing wheel.

5. The apparatus of claim 4 further including spring means for urging said roller of said locking arm against said periphery of said indexing wheel.

6. The apparatus of claim 4 in which said pusher plate is formed with a trip pin, said trip pin being engageable with said locking arm upon movement of said pusher plate in said first direction to pivot said locking arm so that said roller disengages one of said recesses in said indexing wheel, said indexing wheel being rotatable upon further movement of said pusher plate in said first direction with said roller of said locking arm disengaged from said indexing wheel.

7. The apparatus of claim 6 in which said pusher plate is formed with a cam surface engageable with one of said pins on said indexing wheel upon movement of said pusher plate in said second direction, said cam surface being effective to pivot said pusher plate so that said trip pin thereof avoids contact with said locking arm in the course of movement of said pusher plate in said second direction.

8. The apparatus of claim 1 in which said means for pivoting said spray nozzle comprises:

a sleeve movable in a first direction and a second direction along said extension;

a tilt lever fixedly mounted to said nozzle support member, said tilt lever being pivotal with said nozzle support member relative to said adaptor and said spray device;

a crank arm pivotally interconnected between said sleeve and said tilt lever, said crank arm being effective in response to movement of said sleeve in said first direction to pivot said tilt lever in a clockwise direction relative to said adaptor and said spray device and thus pivot said nozzle support member and said spray nozzle connected thereto in a clockwise direction, said crank arm being effective in response to movement of said sleeve in said second direction to pivot said tilt lever in a counterclockwise direction relative to said extension and said spray device and thus pivot said nozzle support member and said spray nozzle in a counterclockwise direction.

9. The apparatus of claim 8 in which said sleeve is formed with an upper disc and a lower disc which are spaced from one another forming a groove therebetween.

10. The apparatus of claim 9 further including means for moving said sleeve along said extension, said means comprising a yoke having one end carried within said groove between said upper and lower discs and a fluid cylinder for moving said yoke relative to said extension, said yoke being effective to engage said lower disc to move said sleeve in one of said first and second directions and to engage said upper disc to move said sleeve in the other of said first and second directions.

11. The apparatus of claim 10 in which said fluid cylinder is connected to a fixed, stop plate, said yoke further including a stop extending between said yoke and said fixed, stop plate, said stop being effective to engage said stop plate at a predetermined point of movement of said yoke to limit the movement of said sleeve along said extension and thus limit the amount of pivotal movement of said spray nozzle.

12. Apparatus for applying a coating material to a surface, comprising:

a spray device including an extension, said spray device being formed with an internal passageway which passes through said extension and includes an inlet communicating with a source of coating material and an outlet formed in said extension, said internal passageway carrying a valve which is movable between an open position and a closed position with respect to said outlet formed in said extension;

a spray nozzle having an inlet and a discharge outlet;

mounting means for pivotally mounting said spray nozzle to said extension, said mounting means including:

(i) a swivel base connected to said extension, said swivel base being formed with a cavity;

(ii) a nozzle support member slidably mounted within said cavity of said swivel base;

(iii) a nozzle holder mounted within a bore formed in said nozzle support member, said nozzle holder fixedly mounting said spray nozzle;

(iv) means for sliding said nozzle support member and thus said nozzle holder and spray nozzle within said swivel base so that said spray nozzle is pivotal with respect to said extension;

means for producing relative movement between said spray device and said surface along an X axis;

means for producing relative movement between said spray device and said surface along a Y axis, said Y axis being perpendicular to said X axis;

means for pivoting said spray nozzle with respect to said extension.

13. The apparatus of claim 12 in which said nozzle support member is formed with an elongated, circumferentially extending slot, said slot being configured so as to maintain communication with said passageway in said extension throughout said sliding motion of said nozzle support member within said swivel base.

14. The apparatus of claim 12 in which said swivel base includes a body portion formed with said cavity therein, said body portion having an opening extending radially outwardly from said cavity within which said nozzle holder and said spray nozzle are movable relative to said swivel base.

15. The apparatus of claim 12 in which said means for sliding said nozzle support member comprises:

a sleeve movable in a first direction and a second direction along said extension;

a shaft connected to said nozzle support member; and a nozzle crank arm connected between said sleeve and said shaft, said nozzle crank arm being effective in response to movement of said sleeve to rotate said shaft and thus slidably pivot said nozzle support member within said cavity in said swivel base so that said nozzle holder and said spray nozzle carried by said nozzle support member are pivoted relative to said extension.

16. The apparatus of claim 12 in which said nozzle support member is carried within said cavity of said swivel base such that said nozzle holder and said spray nozzle are substantially aligned with said extension.

17. The apparatus of claim 12 in which said spray device is formed with a fluid inlet and a recirculation outlet, said extension comprising a first member rotatably mounted to said spray device, said first member being formed with a passageway communicating with said fluid inlet for receiving coating material, said passageway terminating in a discharge outlet, said passageway in said first member carrying a plunger having a hollow interior which is movable between an open position relative to said discharge outlet in said first member wherein coating material is ejected from said discharge outlet and a closed position in which said plunger blocks the flow of coating material through said discharge outlet, said plunger being formed with a first port at one end which transmits coating material from said passageway in said first member into said hollow interior of said plunger, and said plunger being formed with a second port at an opposite end thereof which communicates with said recirculation outlet in said spray device to discharge coating material from said interior of said plunger.

18. The apparats of claim 12 further comprising means for rotating said extension, said means comprising:

an indexing wheel mounted to said extension, said indexing wheel having pins each radially spaced from the center thereof and circumferentially spaced from one another;

locking means for releasably locking said indexing wheel against rotation;

a pusher plate movable in a first direction and in an opposite, second direction, said pusher plate in the course of moving in said first direction being effective to sequentially disengage said locking means from said indexing wheel and then contact one of said pins of said indexing wheel to rotate said indexing wheel and said extension, said locking means being effective to re-engage said indexing wheel prior to movement of said pusher plate in said opposite, second direction to retain said indexing wheel stationary in preparation for engagement of said pusher plate with another of sad pins on said indexing wheel.

19. The apparatus of claim 18 in which said indexing wheel is formed with spaced recesses in the outer periphery thereof, said locking means comprising a locking arm pivotable with respect to said indexing wheel, said locking arm having a roller at one end which is formed to seat within each of said recesses of said indexing wheel, said locking arm being effective to retain said indexing wheel stationary when said roller seats within one of said recesses in said indexing wheel.

20. The apparatus of claim 18 further including spring means for urging said roller of said locking arm against said periphery of said indexing wheel.

21. The apparatus of claim 18 in which said pusher plate is formed with a trip pin, said trip pin being engageable with said locking arm upon movement of said pusher plate in said first direction to pivot said locking arm so that said roller disengages one of said recesses in said indexing wheel, said indexing wheel being rotatable upon further movement of said pusher plate in said first direction with said roller of said locking arm disengaged from said indexing wheel.

22. The apparatus of claim 21 in which said pusher plate is formed with a cam surface engageable with one of said pins on said indexing wheel upon movement of said pusher plate in said second direction, said cam surface being effective to pivot said pusher plate so that said trip pin thereof avoids contact with said locking arm in the course of movement of said pusher plate in said second direction.

23. The apparatus of claim 12 in which said means for pivoting said spray nozzle comprises:
- a sleeve movable in a first direction and a second direction along said extension;
- a tilt lever fixedly mounted to said nozzle support member, said tilt lever being pivotal with said nozzle support member relative to said swivel base and said spray device;
- a crank arm pivotally interconnected between said sleeve and said tilt lever, said crank arm being effective in response to movement of said sleeve in said first direction to pivot said tilt lever in a clockwise direction relative to said swivel base and said spray device and thus pivot said nozzle support member and said spray nozzle connected thereto in a clockwise direction, said crank arm being effective in response to movement of said sleeve in said second direction to pivot said tilt lever in a counterclockwise direction relative to said extension and said spray device and thus pivot said nozzle support member and said spray nozzle in a counterclockwise direction.

24. The apparatus of claim 23 in which said sleeve is formed with an upper disc and a lower disc which are spaced from one another forming a groove therebetween.

25. The apparatus of claim 24 further including means for moving said sleeve along said extension, said means comprising a yoke having one end carried within said groove between said upper and lower discs and a fluid cylinder for moving said yoke relative to said extension, said yoke being effective to engage said lower disc to move said sleeve in one of said first and second directions and to engage said upper disc to move said sleeve in the other of said first and second directions.

26. The apparatus of claim 25 in which said fluid cylinder is connected to a fixed, stop plate, said yoke further including a stop extending between said yoke and said fixed, stop plate, said stop being effective to engage said stop plate at a predetermined point of movement of said yoke to limit the movement of said sleeve along said extension and thus limit the amount of pivotal movement of said spray nozzle.

* * * * *